(12) United States Patent
Chen et al.

(10) Patent No.: US 12,080,764 B2
(45) Date of Patent: Sep. 3, 2024

(54) SEMICONDUCTOR STRUCTURE

(71) Applicant: Vanguard International Semiconductor Corporation, Hsinchu (TW)

(72) Inventors: Chih-Yen Chen, Hsinchu (TW); Franky Juanda Lumbantoruan, Taoyuan (TW); Tuan-Wei Wang, New Taipei (TW); Juin-Yang Chen, New Taipei (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 483 days.

(21) Appl. No.: 17/546,254

(22) Filed: Dec. 9, 2021

(65) Prior Publication Data
US 2023/0187505 A1 Jun. 15, 2023

(51) Int. Cl.
*H01L 29/15* (2006.01)
*H01L 29/205* (2006.01)
*H01L 29/267* (2006.01)
*H01L 29/778* (2006.01)
*H01L 29/20* (2006.01)

(52) U.S. Cl.
CPC .......... *H01L 29/205* (2013.01); *H01L 29/267* (2013.01); *H01L 29/15* (2013.01); *H01L 29/2003* (2013.01); *H01L 29/7786* (2013.01)

(58) Field of Classification Search
CPC ..... H01L 29/205; H01L 29/267; H01L 29/15; H01L 29/2003; H01L 29/7786; H01L 29/432; H01L 29/41766; H01L 29/1066
See application file for complete search history.

(56) References Cited

U.S. PATENT DOCUMENTS

| 9,117,890 B2 * | 8/2015 | Kim ...................... H01L 29/778 |
| 10,573,734 B1 | 2/2020 | Chou et al. |
| 2012/0261716 A1 | 10/2012 | Yanagihara |
| 2014/0097470 A1 | 4/2014 | Kim et al. |
| 2016/0351684 A1 | 12/2016 | Chiu et al. |
| 2019/0319111 A1 | 10/2019 | Suh et al. |

FOREIGN PATENT DOCUMENTS

TW 201921689 A 6/2019

OTHER PUBLICATIONS

Taiwanese Office Action and Search Report for Taiwanese Application No. 110126582, dated Jan. 6, 2022.

* cited by examiner

*Primary Examiner* — David Vu
(74) *Attorney, Agent, or Firm* — Birch, Stewart, Kolasch & Birch, LLP

(57) ABSTRACT

A semiconductor structure includes a substrate, a buffer layer, a channel layer, a barrier layer, a doped compound semiconductor layer, and a composite blocking layer. The buffer layer is on the substrate. The channel layer is on the buffer layer. The barrier layer is on the channel layer. The doped compound semiconductor layer is on the barrier layer. The composite blocking layer is on the doped compound semiconductor layer, the composite blocking layer and the barrier layer include the same Group III element, and the atomic percent of the same Group III element in the composite blocking layer increases with the distance from the doped compound semiconductor layer.

20 Claims, 6 Drawing Sheets

SEMICONDUCTOR STRUCTURE

BACKGROUND

Technical Field

The present disclosure relates to semiconductor structures, and in particular to semiconductor structures with composite blocking layers.

Description of the Related Art

GaN-based semiconductor materials have many excellent material properties, such as high heat resistance, a wide band-gap, high electron saturation velocity, better heat dissipation, and so on. GaN-based semiconductor materials are suitable for high-frequency operation and high-temperature environments. In recent years. GaN-based semiconductor materials have been used in fast charging devices, power supply modules for wireless communication base station, electric vehicle-related components, or other high electron mobility transistors (HEMT) with heterogeneous interface structures.

High electron mobility transistors are also called heterostructure FETs (HFETs) or modulation-doped FETs (MOD-FETs), which include semiconductor materials with different energy gap. A two-dimensional electron gas (2DEG) layer will be generated at the interface between adjacent different semiconductor materials. The high electron mobility transistor may be affected during the processes (such as doping or etching process), resulting in poor electrical performance or poor uniformity. Therefore, developing a structure that may further improve the performance and reliability of a high electron mobility transistor device is still one of the research topics in the industry currently.

BRIEF SUMMARY

An embodiment of the present disclosure provides a semiconductor structure device, which includes a substrate, a buffer layer, a channel layer, a barrier layer, a doped compound semiconductor layer, and a composite blocking layer. The buffer layer is on the substrate. The channel layer is on the buffer layer. The barrier layer is on the channel layer. The doped compound semiconductor layer is on the barrier layer. The composite blocking layer is on the doped compound semiconductor layer, the composite blocking layer and the barrier layer include a same Group III element, and an atom percent of the same Group III element in the composite blocking layer increases with a distance from the doped compound semiconductor layer.

BRIEF DESCRIPTION OF THE DRAWINGS

Aspects of the present disclosure can be more fully understood from the following detailed description when read with the accompanying figures. It should be noted that, in accordance with standard practice in the industry, various features are not drawn to scale. In fact, the dimensions of the various features may be arbitrarily increased or reduced for clarity of discussion.

DETAILED DESCRIPTION

Figure 1:
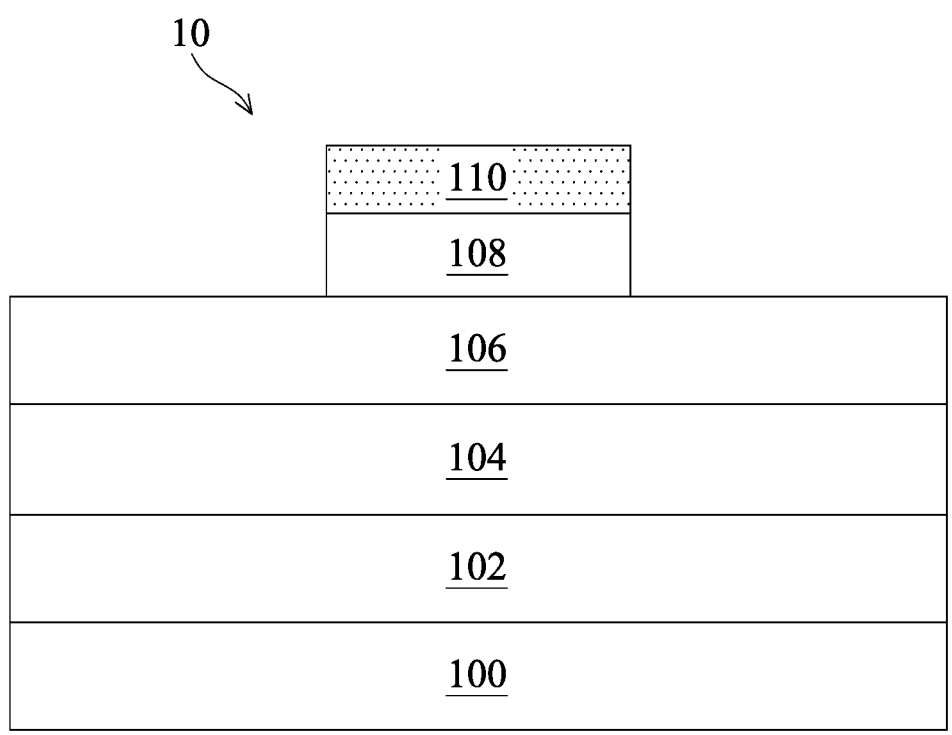
FIGS. 1-4 illustrate cross-sectional views of a semiconductor structure according to some embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In addition, in some embodiments of the present disclosure, terms related to joining and connecting, such as "connected", "interconnected", etc., unless otherwise specified, may mean that two structures are in direct contact, or may also mean that two structures are not in direct contact, and there are other structures located between the two structures. Moreover, the terms of joining and connecting are intended to encompass the case where both structures are movable or both structures are fixed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Still further, when a number or a range of numbers is described with "about," "approximate," and the like, the term encompasses numbers that are within certain variations, such as +/−20%, preferably ±10%, more preferably ±5%, ±3%, ±2%, ±1%, or 0.5% of the number described. For example, the term "about 5 nm" may encompass the dimension range from 4.5 nm to 5.5 nm. The numbers described in the present disclosure are approximate values, that is, if there is no specific description of "about," "approximately." and the like, the numbers described may still imply "about," "approximately," and the like.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Some embodiments of the present disclosure provide a semiconductor structure with a composite blocking layer, which may avoid the adverse effects of doping, etching, or other processes on the semiconductor structure, and further improve the electrical performance. In some embodiments, the semiconductor structure has a cap layer configured to protect other components, and the configuration of the cap layer may be adjusted according to different processes or design requirements.

FIG. 1 is a cross-sectional view of the semiconductor structure 10 according to some embodiments of the present invention. The semiconductor structure 10 includes a substrate 10, a buffer layer 102, a channel layer 104, a barrier layer 106, a doped compound semiconductor layer 108 and a composite blocking layer 110. The substrate 100 may include elemental semiconductors, such as silicon (Si) or germanium (Ge) and the substrate 100 may be p-doped or undoped. The substrate 100 may include compound semiconductors, such as silicon carbide, gallium arsenide (GaAs), gallium phosphide (GaP), indium phosphide (InP), indium arsenide (InAs) and/or indium antimonide (InSb); alloy semiconductors, such as silicon germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP) and/or gallium indium arsenic phosphide (GaInAsP).

In some embodiments, the substrate 100 may be a ceramic substrate, such as an aluminum nitride (AlN) substrate, a silicon carbide (SiC) substrate, an aluminum oxide ($Al_2O_3$) substrate (or called a sapphire substrate), a glass substrate, or other similar substrates. In some embodiments, the substrate 100 may include a core base and at least one insulating layer. In some embodiments, the at least one insulating layer encapsulating the core base. The core base may include a ceramic material, and the ceramic material may include a metal inorganic material. For example, the core base may include silicon carbide, aluminum nitride, sapphire substrate, or other suitable materials. The aforementioned sapphire substrate may be aluminum oxide. In other embodiments, the substrate 100 may be a semiconductor on insulator substrate, for example, silicon on insulator (SOI) or silicon germanium on insulator (SGOI).

In a semiconductor structure, the lattice structure, thermal expansion coefficient, or other material properties of the substrate may be different from the upper feature (such as the channel layer 104 or other features). Therefore, strain may occur at the interface between the substrate and the upper feature or near the interface between adjacent different semiconductor materials, leading to defects such as cracks or bows. In some embodiments, the buffer layer 102 is disposed on the substrate 100 to release strain in the features (for example, the channel layer 104) formed above the buffer layer 102, thereby preventing the formation of defects. The material of the buffer layer 102 may include: AlN, GaN, $Al_xGa_{1-x}N$ (where 0<x<1), a combination thereof, or other similar materials. The buffer layer 102 may be formed by an epitaxial growth process, such as metal organic chemical vapor deposition (MOCVD), hydride vapor phase epitaxy (HVPE), molecular beam epitaxy (MBE), a combination thereof, or other methods.

In some embodiments, the channel layer 104 is disposed on the buffer layer 102, and the material of the channel layer 104 includes one or more group III-V compound semiconductor materials, such as group III nitrides. For example, the material of the channel layer 104 may include GaN, AlGaN, AlInN, InGaN, InAlGaN, other suitable materials, or a combination thereof. In some embodiments, the channel layer 104 may be doped with n-type dopants or p-type dopants. The channel layer 104 may be formed by metal organic chemical vapor deposition (MOCVD), hydride vapor phase epitaxy (HVPE), molecular beam epitaxy (MBE), liquid phase epitaxy (LPE), atomic layer deposition (ALD), other appropriate methods, or a combination thereof.

In some embodiments using a GaN layer as a channel layer, the breakdown voltage of the high electron mobility transistor mainly depends on the thickness of the GaN layer. For example, increasing the thickness of the GaN layer may effectively increase the breakdown voltage of the high electron mobility transistor. In one such embodiment, in order to deposit GaN material on the substrate during the process of forming the GaN layer, it is necessary to use a substrate with high thermal conductivity and high mechanical strength, otherwise the substrate may be bent or even cracked. For example, compared to a silicon (Si) substrate, an AlN substrate has higher thermal conductivity and mechanical strength, so a thicker GaN layer may be formed on the AlN substrate to avoid bending or cracking of the substrate. It should be noted that the aforementioned use of an AlN substrate and the formation of a GaN layer on it are merely examples, and do not limit the materials of the substrate or the channel layer used in the embodiments of the present disclosure. A GaN layer or a channel layer including other materials may be formed on other substrates, according to different process conditions and design requirements.

In some embodiments, the barrier layer 106 is disposed on the channel layer 104, and the material of the barrier layer 106 includes a ternary III-V compound semiconductor, such as a III nitride. For example, the material of the barrier layer 106 may be AlGaN, AlInN, or a combination thereof. In other embodiments, the material of the barrier layer 106 includes GaN, AlN, GaAs. GaInP, AlGaAs, InP, InAlAs, InGaAs, other appropriate III-V materials, or a combination thereof. In some embodiments, the barrier layer 106 may be doped, for example, doped with n-type dopants or p-type dopants. The barrier layer 106 may be formed by an epitaxial growth process, such as metal organic chemical vapor deposition, hydride vapor phase epitaxy, molecular beam epitaxy, a combination thereof, or other methods.

According to some embodiments of the present disclosure, the channel layer 104 and the barrier layer 106 are made of different materials, and their interface is a heterojunction. Therefore, the channel layer 104 and the barrier layer 106 have a lattice mismatch. Stress is generated to cause piezoelectric polarization effects, and the ionic character of a bonding between group III metals (such as Al, Ga, or In) and nitrogen is relatively strong, leading to spontaneous polarization. Due to the difference in energy gap between the channel layer 104 and the barrier layer 106 and the aforementioned piezoelectric polarization and spontaneous polarization effects, a two-dimensional electron gas (2DEG) (not shown) is formed in the heterogeneous interface between the channel layer 104 and the barrier layer 106. In some embodiments, the semiconductor structure includes a high electron mobility transistor (HEMT) that uses two-dimensional electron gas (2DEG) as conductive carriers.

Referring to FIG. 1, in some embodiments, the semiconductor structure 10 includes a multi-layer stack (or a multi-layer mesa) formed by a doped compound semiconductor layer 108 disposed on the barrier layer 106 and a composite blocking layer 110 on the doped compound semiconductor layer 108. In some embodiments, the doped compound semiconductor layer 108 includes a p-type doped III-V semiconductor, such as GaN, AlGaN, AlN, GaAs, AlGaAs. InP, InAlAs, InGaAs, or other IIII-V semiconductors. In other embodiments, the doped compound semiconductor layer 108 includes a p-type doped II-VI group semiconductor, such as CdS, CdTe, ZnS, or other II-VI group semiconductors. The doped compound semiconductor layer 108 may be formed by metal organic chemical vapor deposition, hydride vapor phase epitaxy, molecular beam epitaxy, a combination thereof, or other methods. In some embodiments, the doped compound semiconductor layer 108 may be doped, for example, the dopants include magnesium (Mg), zinc (Zn), calcium (Ca), beryllium (Be), strontium (Sr), Barium (Ba), radium (Ra), carbon (C), silver (Ag), gold (Au), lithium (Li) or sodium (Na), and the doped compound semiconductor layer 108 is p-doped. In some embodiments, the doping concentration of the doped compound semiconductor layer 108 is about 1 E19 $cm^{-3}$ to about 4E19 $cm^{-3}$, for example, about 2.8E19 $cm^{-3}$.

In a semiconductor structure, due to the difference in potential energy between different features, the voltage applied during operation, or other process/operating conditions, carriers in the doped feature may move to other adjacent features and lead to adverse effects. For example, the carriers of the doped compound semiconductor layer may be affected by the aforementioned influences and move into gate electrode formed later, resulting in current leakage and carrier trapping. In addition, the dopants in the doped feature may diffuse to other adjacent features, leading to the aforementioned adverse effects such as current leakage and carrier trapping. In a gate switching process, the trapped carriers will cause the threshold voltage shift ($V_T$ shift) to reduce the gate switching efficiency. This may increase the time required for the device to turn on and cause gate lag. In general, the doping concentration of the doped compound semiconductor layer is positively correlated with the carrier concentration that is affected and moved to other nearby features and the doping concentration that diffuses to other nearby features. However, the predetermined threshold voltage of the device mainly depends on the doping concentration of the doped compound semiconductor layer. If the doping concentration of the doped compound semiconductor layer is adjusted in order to avoid leakage and carrier trapping, the predetermined threshold voltage will be changed. This will make the device fail to meet the performance required by the design. On the other hand, if the doping concentration of the doped compound semiconductor layer is relatively high, such as 2.8E19 $cm^{-3}$, although a required threshold voltage (Vt) may be reached, it is prone to high gate leakage current and gate delay. Therefore, a composite doped compound semiconductor layer is needed to eliminate this side effect.

According to some embodiments of the present disclosure, disposing the composite blocking layer 110 on the doped compound semiconductor layer 108 may suppress gate leakage caused by the doping of high-concentration dopants (for example, high-concentration magnesium or other p-type dopants). In some embodiments, the composite blocking layer 110 and the barrier layer 106 include the same group III element (or a third group element), and the atomic percentage of the same group III element 110 in the composite blocking layer increases with a distance away from the doped compound semiconductor layer 108. In other words, the composite blocking layer 110 has an increased concentration gradient of group III elements in a direction away from the doped compound semiconductor layer 108. The composite blocking layer 110 may be formed by metal organic chemical vapor deposition, hydride vapor phase epitaxy, molecular beam epitaxy, liquid phase epitaxy, atomic layer deposition, other appropriate methods, or a combination thereof. In one embodiment, the composite blocking layer 110 is grown in situ in a metal organic chemical vapor deposition process chamber where the doped compound semiconductor layer 108 is formed. In some embodiments, the process of forming the doped compound semiconductor layer 108 and the composite blocking layer 110 includes sequentially depositing a doped compound semiconductor material layer and a composite blocking material layer on the barrier layer 106, and patterning the doped compound semiconductor material layer and the composite blocking material layer to expose the barrier layer 106, thereby forming a multilayer stack or a multilayer mesa of the doped compound semiconductor layer 108 and the composite blocking layer 110. The patterning process includes (but is not limited to) lithography process and etching process. In some embodiments, the lithography process may include photoresist coating, soft baking, hard baking, mask aligning, exposure, baking after exposure, developing photoresist, rinsing, drying or other suitable processes. In some embodiments, the etching process may include a dry etching process, a wet etching process, or a combination thereof. For example, the dry etching process may include a reactive ion etch (RIE) process or a plasma etching process. In some embodiments where the doped compound semiconductor layer 108 is doped with magnesium or other p-type dopants, the composite blocking layer 110 may interrupt the growth of magnesium or other p-type dopants (that is, well block the diffusion of dopants), blocking a memory effect of magnesium or other dopants, thereby effectively obtaining lower doping of magnesium or other p-type dopants than the doped compound semiconductor layer to improve electrical performance. In some embodiments, the doping concentration of the doped compound semiconductor layer 108 is about 1 E19 $cm^{-3}$ to about 4E19 $cm^{-3}$, for example, about 2.8E19 $cm^{-3}$, and the doping concentration of the composite blocking layer 110 is about 5E17 $cm^{-3}$ to about 5E18 $cm^{-3}$, for example about 2E18 $cm^{-3}$.

Figure 2:
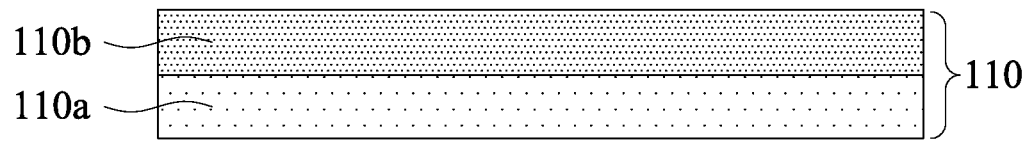
Figure 3:
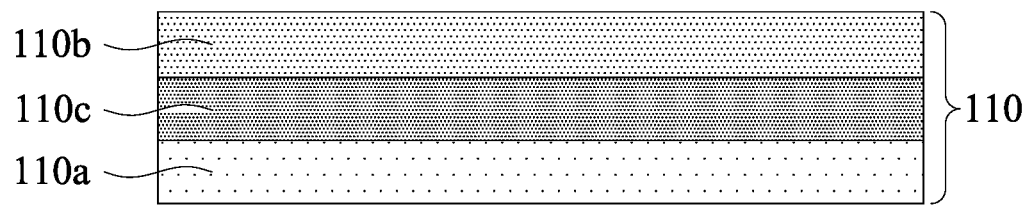
Figure 4:
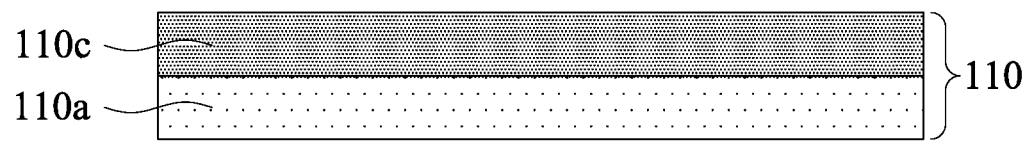

FIGS. 2-4 illustrate cross-sectional views of the composite blocking layer 110, according to some embodiments of the present disclosure. In these embodiments, the composite blocking layer 110 includes at least two layers, and each includes a group III element. For example, the group III element may include boron (B), aluminum (Al), gallium (Ga) or indium (In) or other group III elements. Referring to FIG. 2, in some embodiments, the composite blocking layer 110 includes a first blocking layer 110a and a second blocking layer 110b thereon. The first blocking layer 110a and the second blocking layer 110b may be sequentially formed by metal organic chemical vapor deposition, hydride vapor phase epitaxy, molecular beam epitaxy, liquid phase epitaxy, atomic layer deposition, other appropriate methods, or a combination thereof, respectively. In some embodiments, the atomic percentage of the group III element of the second blocking layer 110b increases with distance from the doped compound semiconductor layer 108. In some embodiments, the first blocking layer 110a may be an AlGaN layer and the second blocking layer 110b may be an AlN layer or an $Al_xGa_{(1-x)}N$ layer (0<x<1). In some embodiments, the value of x representing the aluminum content in the $Al_xGa_{(1-x)}N$ layer may be a variable, and the value of x increases in the direction away from the doped compound semiconductor layer 108 (the range of the value of x is still between 0 and 1, that is, 0<x<1). In other words, the $Al_xGa_{(1-x)}N$ layer has a concentration gradient of aluminum. In some embodiments, the composite blocking layer 110 with a concentration gradient of aluminum (or other group III elements) may provide a stress buffer between the upper and lower layers, so as to slow down or prevent cracks at the interface between the upper and lower layers, due to the material, crystal lattice or other differences of the layers. At the same time, the polarization between the barrier layer and the doped compound semiconductor layer may be eliminated, and additional carrier trapping may be avoided. In some embodiments, the composite blocking layer 110 is p-doped or undoped. For example, the first blocking layer 110a may be p-doped or undoped, and the second blocking layer 110b may be p-type doped or undoped. In the embodiment where the composite blocking layer 110 is p-doped, the doping concentration of the composite blocking layer 110 is much smaller than the doping concentration of the doped compound semiconductor layer 108. For example, the doping concentration of the composite blocking layer 110 is 1 to 2 orders of magnitude smaller than that of the doped compound semiconductor layer 108. In these embodiments, the doping concentration of the first blocking layer 110a is about $5E17$ cm$^{-3}$ to about $5E18$ cm$^{-3}$, for example, about $2E18$ cm$^{-3}$, and the doping concentration of the second blocking layer 110b is about $2E17$ cm$^{-3}$ to about $2E18$ cm$^{-3}$ (for example, about $8E17$ cm$^{-3}$) or about $5E16$ cm$^{-3}$ to about $5E17$ cm$^{-3}$ (for example, about $2E17$ cm$^{-3}$). It should be noted that, in some embodiments, the term "undoped feature" refers to that the feature is not doped by diffusion or ion implantation process. However, during the subsequent process, dopants may inadvertently diffuse into the feature, causing it to have a low or negligible doping concentration.

Referring to FIG. 3, in some embodiments, the composite blocking layer 110 includes a first blocking layer 110a, a third blocking layer 110c on the first blocking layer 110a, and a second blocking layer 110b on the third blocking layer 110c. In these embodiments, the third blocking layer 110c is located between the first blocking layer 110a and the second blocking layer 110b. The first blocking layer 110a, the third blocking layer 110c, and the second blocking layer 110b may be sequentially formed by metal organic chemical vapor deposition, hydride vapor phase epitaxy, molecular beam epitaxy, liquid phase epitaxy, atomic layer deposition, other appropriate methods, or a combination thereof, respectively. In some embodiments, as a whole, the atomic percentage of one of the group III elements in the composite blocking layer 110 of FIG. 3 increases with distance from the doped compound semiconductor layer 108, thereby providing a stress buffer between the layers. For example, in some embodiments, the first blocking layer 110a is an AlGaN layer the third blocking layer 110b is an Al$_x$Ga$_{(1-x)}$N layer (where $0<x<1$), and the second blocking layer 110b is an AlN layer, wherein the x value of the Al$_x$Ga$_{(1-x)}$N layer ($0<x<1$) increases in the direction away from the doped compound semiconductor layer 108, and the Al concentration (percentage) of the Al$_x$Ga$_{(1-x)}$N layer is higher than that of AlGaN layer to provide stress buffer. In addition, in some embodiments, the second blocking layer 110b (for example, an AlN layer or a layer with other group III elements) may more effectively interrupt the growth of magnesium or other p-type dopants, and block the memory effect of magnesium or other dopants, to achieve better electrical performance. In some embodiments, the first blocking layer 110a, the second blocking layer 110b, and the third blocking layer 110c are p-doped or undoped, respectively. In some embodiments, the doping concentration of the first blocking layer 110a may be about $5E17$ cm$^{-3}$ to about $5E18$ cm$^{-3}$, for example, about $2E18$ cm$^{-3}$, and the doping concentration of the third blocking layer 110c may be about $5E16$ cm$^{-3}$ to about $5E17$ cm$^{-3}$, for example, about $2E17$ cm$^{-3}$, the doping concentration of the second blocking layer 110b may be about $2E17$ cm$^{-3}$ to about $2E18$ cm$^{-3}$, for example, about $8E17$ cm$^{-3}$. In some embodiments, the atomic percentage of one of the group III elements in the third blocking layer 110c is higher than the atomic percentage of the group III element in the first blocking layer 110a.

Referring to FIG. 4, in some embodiments, the composite blocking layer 110 includes a first blocking layer 110a and a third blocking layer 110c thereon. In some embodiments, the first blocking layer 110a, the third blocking layer 110c may be sequentially formed by metal organic chemical vapor deposition, hydride vapor phase epitaxy, molecular beam epitaxy, liquid phase epitaxy, atomic layer deposition, other suitable methods, or a combination thereof. In some embodiments, the first blocking layer 110a may provide a stress buffer between the third blocking layer 110c and the doped compound semiconductor layer 108. According to some embodiments, the first blocking layer 110a is an AlGaN layer and the third blocking layer 110c is an Al$_x$Ga$_{(1-x)}$N layer (where $0<x<1$). In some embodiments, the composite blocking layer 110 is p-doped or undoped. For example, the first blocking layer 110a may be p-doped or undoped, and the third blocking layer 110c may be p-doped or undoped. In an embodiment where the first blocking layer 110a is p-doped, the doping concentration thereof is about $5E17$ cm$^{-3}$ to about $5E18$ cm$^{-3}$, for example, about $2E18$ cm$^{-3}$. In an embodiment where the third blocking layer 110c is p-doped, the doping concentration thereof is about $5E16$ cm$^{-3}$ to about $5E17$ cm$^{-3}$, for example, about $2E17$ cm$^{-3}$. Compared with a blocking layer composed of a single layer or a single material, the composite blocking layer of some embodiments of the present disclosure may better block the memory effect of the dopants and may better prevent the carriers from moving from the doped compound semiconductor layer to the adjacent features that cause leakage and carrier capture.

Figure 5:
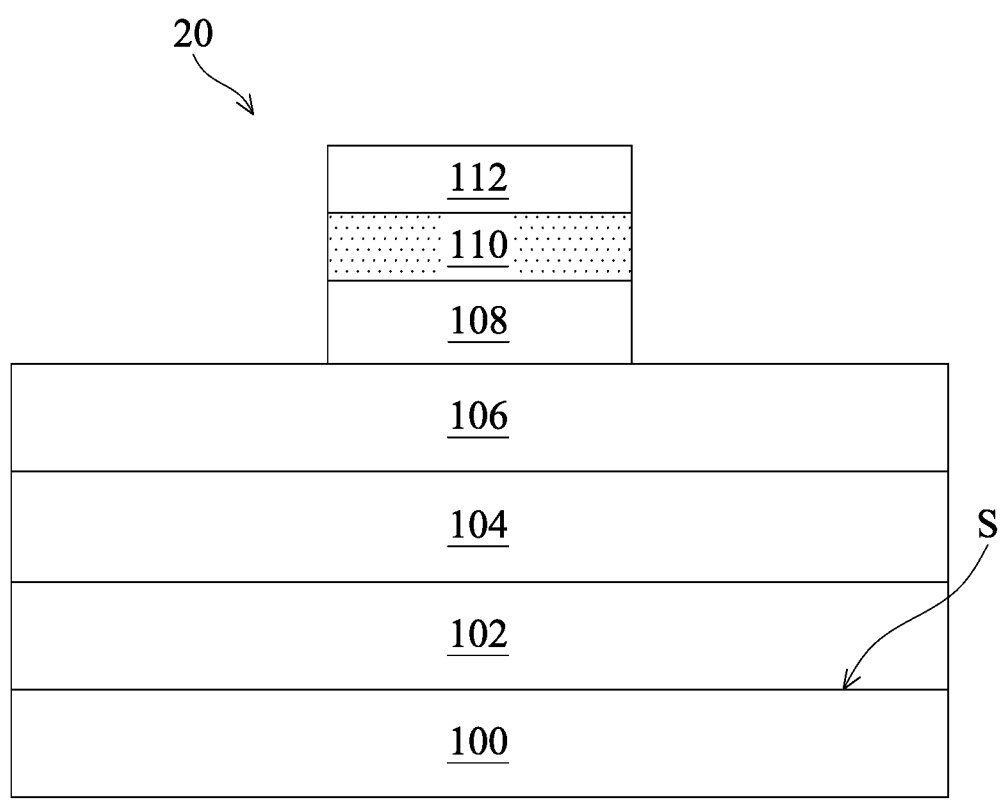
FIGS. 5-9 illustrate cross-sectional views of a semiconductor structure according to other embodiments of the present disclosure.
Figure 6:
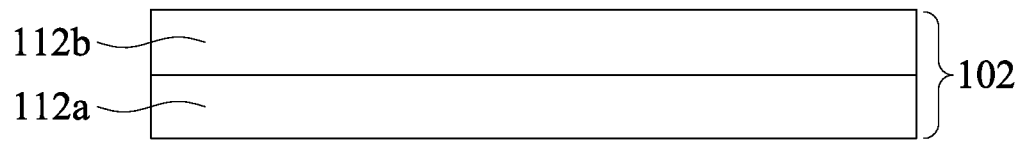

FIG. 5 illustrates a cross-sectional view of the semiconductor structure 20 according to other embodiments of the present disclosure. The semiconductor structure 20 is similar to the semiconductor structure 10 in FIG. 1, and the semiconductor structure 20 further includes a cap layer 112 disposed on the composite blocking layer 110. The cap layer 112 may include one or more layers of nitride. In some embodiments, the cap layer 112 includes a p-type doped or undoped gallium nitride (GaN) layer, which may improve the surface morphology of the semiconductor structure 20. For example, the GaN layer may be disposed on the top surface of the composite blocking layer 110 (for example, on the second blocking layer 110b or the third blocking layer 110c) to reduce the surface roughness of the semiconductor structure 20 to improve the quality of layer stacking subsequently formed thereon. In some embodiments, the cap layer 112 includes a p-doped or undoped silicon nitride (SiN) layer, and the SiN layer may be disposed on the top surface of the composite blocking layer 110 (for example, on the second blocking layer 110b or on the third blocking layer 110c), to passivate the surface of the composite blocking layer 110. According to some embodiments, the cap layer 112 includes a first nitride layer 112a and a second nitride layer 112b on the first nitride layer 112a. For example, the first nitride layer 112a includes GaN and the second nitride layer 112b includes SiN. In some embodiments, the cap layer 112 includes a p-doped or undoped first nitride layer 112a and a p-doped or undoped second nitride layer 112b on the first nitride layer 112a, as shown in FIG. 6. For example, the material of the first nitride layer 112a may include GaN or other suitable materials; and the material of the second nitride layer 112b may include SiN or other suitable materials. In some embodiments, the thickness of the first nitride layer 112a is about 1 nm to 10 nm, and the thickness of the second nitride layer 112b is about 2 nm to 20 nm.

Figure 7:
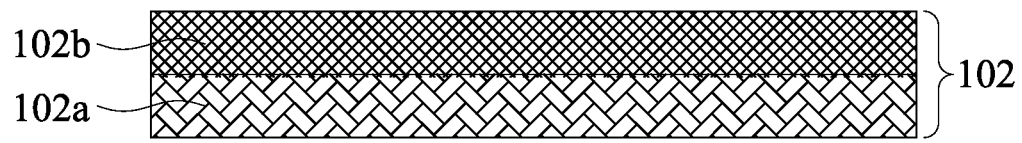
Figure 8:
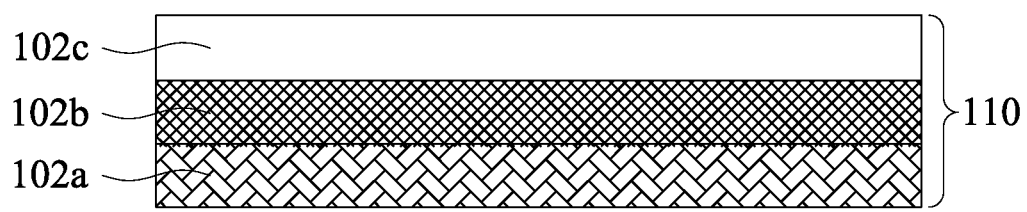

FIGS. 7-8 illustrate cross-sectional views of the buffer layer 102 according to other embodiments of the present disclosure. In these embodiments, the buffer layer 102 includes at least one superlattice layer. Referring to FIG. 7, in some embodiments, the buffer layer 102 includes a first superlattice layer 102a and a second superlattice layer 102b that have different period to alleviate the lattice difference between the substrate 100 and other layers formed thereon, so as to avoid defects such as bows or cracks due to lattice mismatch when forming these layers. According to some embodiments, the buffer layer 102 includes a first superlattice layer 102a and a second superlattice layer 102b stacked in pairs, the first superlattice layer 102a has tensile stress and the second superlattice layer 102b has compression stress. In some embodiments, the first superlattice layer 102a and the second superlattice layer 102b are stacked along a direction perpendicular to the main surface S of the substrate 100. It should be noted that the number of superlattice layers shown in the figure is only an example, and the number of superlattice layers may be one or more than two, according to the material of the layer on the substrate 100 and/or the process for forming these materials. Referring to FIG. 8, in some embodiments, the buffer layer 102 further includes a resistance layer 102c, which is disposed on the superlattice layer. In these embodiments, the resistance layer 102c serves as an electrical resistance layer to reduce leakage current. In some embodiments, the resistance layer 102c is a binary, ternary III-V compound or a doped III-V group compound semiconductor. In some embodiments, the resistance layer 102c is a GaN layer doped with carbon or iron, and the doping concentration is about 6E18 $cm^{-3}$ to about 6E19 $cm^{-3}$, for example, about 4E19 $cm^{-3}$.

Figure 9:
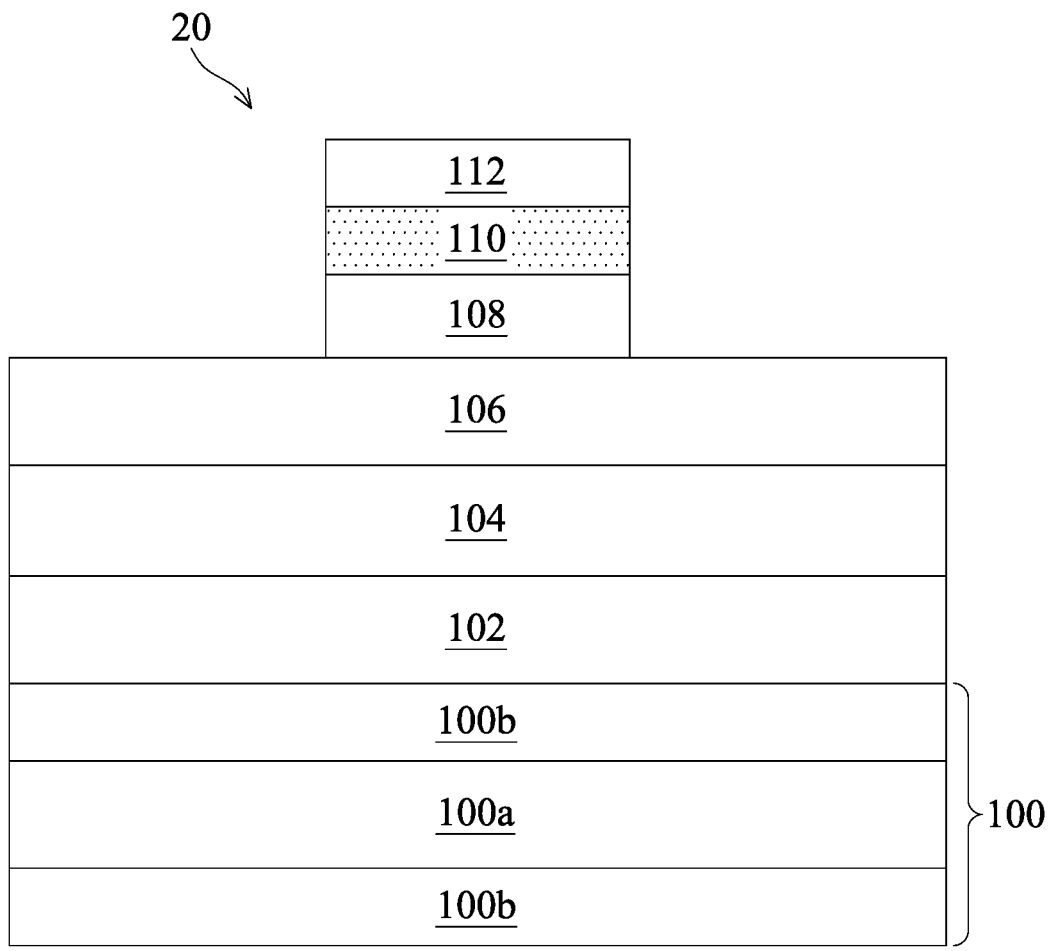

FIG. 9 illustrates a cross-sectional view of a semiconductor structure 20, according to other embodiments of the present disclosure. The substrate 100 includes a ceramic substrate 100a and a pair of base material blocking layer 100b respectively disposed on the upper and lower surfaces of the ceramic substrate 100a. In some embodiments, the substrate blocking layer 100b on the upper surface and the lower surface of the ceramic substrate 100a includes a single layer or multiple layers of insulating material and/or other suitable material layers, such as semiconductor layers. The insulating material layer may be oxide, nitride, oxynitride, or other suitable insulating materials. The semiconductor layer may be polysilicon. The substrate blocking layer 100b may prevent diffusion between the ceramic substrate 100a and other features, and may also prevent the ceramic substrate 100a from interacting with other layers or process environments. In some embodiments, the substrate blocking layer 100b may also encapsulate the ceramic substrate 100a. In these embodiments, the substrate blocking layer 100b not only covers the upper and lower surfaces of 100a, but also covers the side surfaces of 100a.

Figure 10:
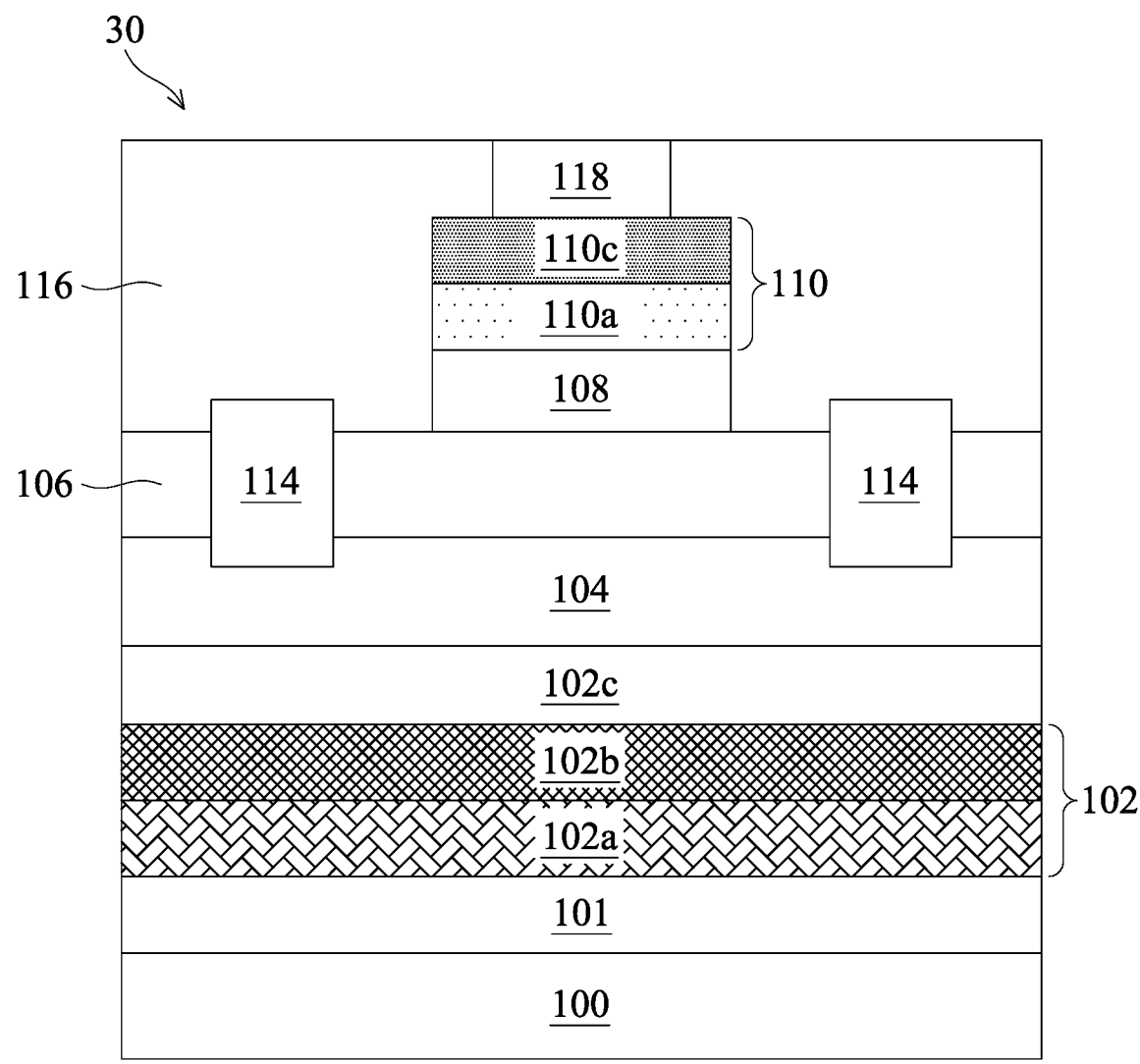
FIG. 10 illustrates cross-sectional views of a semiconductor structure according to further embodiments of the present disclosure.

FIG. 10 illustrates a cross-sectional view of the semiconductor structure 30 according to further embodiments of the present disclosure. The semiconductor structure 30 includes a substrate 100, a nucleation layer 101, a buffer layer 102, a channel layer 104, a barrier layer 106, a doped compound semiconductor layer 108, a composite blocking layer 110, a gate electrode 118, and a source/drain electrode 114. The buffer layer 102 of the semiconductor structure 30 includes a first superlattice layer 102a, a second superlattice layer 102b, and a resistance layer 102c. The composite blocking layer 110 of the semiconductor structure 30 includes a first blocking layer 110a and a third blocking layer 110c. It should be noted that, according to some embodiments of the present disclosure, the buffer layer 102 of the semiconductor structure 30 may also be two layers as shown in FIG. 7 or at least one layer described above; and the composite blocking layer 110 of the semiconductor structure 30 may also be such as the composite blocking layer shown in FIG. 2 or 3. The gate electrode 118 is disposed on the composite blocking layer 110 and the source/drain electrode 114 is disposed on opposite sides of the gate electrode 118. The composite blocking layer 110 may realize the growth interruption of the doped compound semiconductor layer 108, and prevent the dopants from diffusing into the gate electrode 118 (for example, to the gate metal layer in the gate electrode 118) or other features, to achieve a zero or low dopant concentration surface in other features, which is beneficial to reduce leakage and carrier trapping, thereby avoiding gate delay and improving electrical performance. In some embodiments, the source/drain electrodes 114 extend through the barrier layer 106 into the channel layer 104. In some embodiments, the semiconductor structure 30 includes a passivation layer 116 disposed on the barrier layer 106 and the source/drain electrodes 114. The material of the passivation layer 116 may include $SiO_2$, SiON, $Al_2O_3$, AlN, polyimide (PI), benzocyclobutene (BCB), polybenzoxazole (PBO), other insulating materials, or a combination thereof. In some embodiments, the passivation layer 116 may be formed using metal organic vapor deposition, chemical vapor deposition, spin coating, other appropriate methods, or a combination thereof. In some embodiments, the process of forming the gate electrode 118 includes etching through the passivation layer 116 to form an opening above the doped compound semiconductor layer 108, filling the opening with a gate metal material layer and/or other material layer, and remove excess material outside the opening. During the etching of the passivation layer 116, the composite blocking layer 110 may serve as an etch stop layer, and during the process of filling the material layer to the opening and other subsequent processes, the composite blocking layer 110 may protect the underlying doped compound semiconductor layer 108 and/or barrier layer 106.

In some embodiments, the core layer 101 is disposed between the substrate 100 and the buffer layer 102. The nucleation layer 101 may alleviate the crystal lattice difference between the substrate 100 and the layer grown thereon, so as to improve the crystal quality. The material of the nucleation layer may include AlN, $Al_2O_3$, AlGaN, SiC, Al, a combination thereof, or other materials. The nucleation layer 101 with a single-layer or multi-layer structure may be formed by a suitable process, such as chemical vapor deposition, atomic layer deposition, physical vapor deposition, other processes, or a combination thereof. In some embodiments, the material of the buffer layer 102 depends on the material of the nucleation layer 101 and the gas introduced during the epitaxial process.

The semiconductor structure provided by the embodiments of the present disclosure includes a composite blocking layer, which may prevent the memory effect of the dopants in the doped compound semiconductor layer and prevent the carriers from moving to adjacent features, thereby avoiding leakage and carrier trapping. The composite blocking layer of the embodiment of the present disclosure may also be used as a protective layer and an etching stop layer. In some embodiments, the semiconductor structure further includes a cap layer disposed on the composite blocking layer, which may improve the quality of layer stacking thereon.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a substrate;
   a buffer layer on the substrate;
   a channel layer on the buffer layer;
   a barrier layer on the channel layer;
   a doped compound semiconductor layer on the barrier layer; and
   a composite blocking layer on the doped compound semiconductor layer,
   wherein the composite blocking layer and the barrier layer comprise a same group III element, and an atomic percentage of the same group III element in the composite blocking layer increases with distance away from the doped compound semiconductor layer.

2. The semiconductor structure of claim 1, wherein the composite blocking layer comprises:
   a first blocking layer on the doped compound semiconductor layer; and
   a second blocking layer on the first blocking layer.

3. The semiconductor structure of claim 2, wherein the composite blocking layer further comprises a third blocking layer disposed between the first blocking 2 layer and the second blocking layer.

4. The semiconductor structure of claim 3, wherein the first blocking layer, the second blocking layer and the third blocking layer are p-doped or undoped.

5. The semiconductor structure of claim 2, wherein the second blocking layer comprises AlN or $Al_xGa_{(1-x)}N$, wherein $0<x<1$.

6. The semiconductor structure of claim 1, further comprising:
   a cap layer on the composite blocking layer.

7. The semiconductor structure of claim 6, wherein the cap layer comprises a gallium nitride (GaN) layer with p-type doped or undoped.

8. The semiconductor structure of claim 7, wherein the cap layer comprises a silicon nitride (SiN) layer with p-doped or undoped on the gallium nitride (GaN) layer.

9. The semiconductor structure of claim 6, wherein the cap layer comprises a silicon nitride (SiN) layer with p-doped or undoped.

10. The semiconductor structure of claim 6, wherein the cap layer comprises:
    a first nitride layer on the composite blocking layer; and
    a second nitride layer on the first nitride layer.

11. The semiconductor structure of claim 10, wherein the first nitride layer comprises gallium nitride, the second nitride layer comprises silicon nitride and the first nitride layer and the second nitride layer are p-doped or undoped.

12. The semiconductor structure of claim 1, wherein the buffer layer comprises at least one stacked superlattice.

13. The semiconductor structure of claim 12, wherein the at least one stacked superlattice is plural.

14. The semiconductor structure of claim 12, wherein the at least one stacked superlattice comprises a first superlattice layer and a second superlattice layer stacked in pairs, wherein the first superlattice layer has tensile stress and the second superlattice layer has compressive stress.

15. The semiconductor structure of claim 14, wherein the second superlattice layer is disposed on the first superlattice layer.

16. The semiconductor structure of claim 12, wherein the buffer layer further comprises a resistance layer on the at least one stacked superlattice.

17. The semiconductor structure of claim 16, wherein the resistance layer comprises a doped III-V group compound semiconductor.

18. The semiconductor structure of claim 1, wherein the substrate comprise sapphire, silicon, silicon carbide (SIC), aluminum oxide ($Al_2O_3$), aluminum nitride (AlN), silicon on insulator (SOI) or a combination thereof.

19. The semiconductor structure of claim 1, wherein the substrate comprises a core base and at least one insulating layer.

20. The semiconductor structure of claim 1, further comprising:
    a gate electrode on the composite blocking layer; and
    a source electrode and a drain electrode on opposite sides of the gate electrode.

* * * * *